(12) United States Patent
Takano

(10) Patent No.: US 12,525,939 B2
(45) Date of Patent: Jan. 13, 2026

(54) SEMICONDUCTOR INTEGRATED CIRCUIT DEVICE

(71) Applicant: Yoichi Takano, Hadano (JP)

(72) Inventor: Yoichi Takano, Hadano (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 559 days.

(21) Appl. No.: 18/054,164

(22) Filed: Nov. 10, 2022

(65) Prior Publication Data

US 2023/0155559 A1    May 18, 2023

(30) Foreign Application Priority Data

Nov. 12, 2021   (JP) ................... 2021-185068

(51) Int. Cl.
*H03F 3/45*     (2006.01)
*H03F 3/72*     (2006.01)

(52) U.S. Cl.
CPC ........... *H03F 3/72* (2013.01); *H03F 3/45179* (2013.01); *H03F 2203/7227* (2013.01)

(58) Field of Classification Search
CPC ................... H03F 3/72; H03F 3/45179; H03F 2203/7227; H03K 17/165; H03K 17/162; H03K 17/687; H03K 2217/0063
USPC ......................................................... 330/253
See application file for complete search history.

(56) References Cited

U.S. PATENT DOCUMENTS

2009/0128108 A1* 5/2009 Yamashita ............... G05F 1/56
                                                          323/281

FOREIGN PATENT DOCUMENTS

| JP | H05-313762 A | 11/1993 |
|---|---|---|
| JP | 2000-112548 A | 4/2000 |
| JP | 2000-163141 A | 6/2000 |
| JP | 2002091584 A | 3/2002 |
| JP | 2007-249384 A | 9/2007 |
| JP | 2012090214 A | 5/2012 |
| WO | 2020073313 A1 | 4/2020 |

OTHER PUBLICATIONS

Notice of Reasons for Refusal for Japanese Patent Application No. 2021-185068, dated Apr. 30, 2025.

* cited by examiner

*Primary Examiner* — Andrea Lindgren Baltzell
*Assistant Examiner* — Khiem D Nguyen
(74) *Attorney, Agent, or Firm* — Shih IP Law Group, PLLC.

(57) ABSTRACT

Disclosed is a semiconductor integrated circuit device including: a switching transistor; a terminal to receive a control signal from outside; and a control circuit that controls the switching transistor based on the control signal. The control circuit includes: a reference voltage source that generates a reference voltage from the DC voltage; a differential amplifier to receive the reference voltage and a voltage of the voltage output terminal, and output a voltage applied to a control terminal of the switching transistor; and a logic circuit that generates a signal to control an operation state of the differential amplifier based on the control signal. According to an output signal of the logic circuit, the differential amplifier controls the switching transistor to be on in response to the control signal being a first logic level, and to be off in response to the control signal being a second logic level.

6 Claims, 4 Drawing Sheets

SEMICONDUCTOR INTEGRATED CIRCUIT DEVICE

CROSS-REFERENCE TO RELATED APPLICATION

This application is based upon and claims the benefit of priority from the prior Japanese Patent Application No. 2021-185068, filed on Nov. 12, 2021, the entire contents of which are incorporated herein by reference.

BACKGROUND

Technical Field

The present disclosure relates to a semiconductor integrated circuit device (IC) that includes a switching transistor connected between a voltage input terminal and an output terminal and a circuit that controls the transistor on and off. The present disclosure relates to, for example, a technique which is effective for use in a high-side switch IC.

Description of Related Art

There is a high-side switch IC as an element (device) provided on the power line that supplies power supply voltage from the power supply to the load and supplies or interrupts the power supply voltage to the load.

As shown in FIG. 5, the high-side switch IC is provided on the power line 22 that supplies power supply voltage from a USB power supply (power supply 20) to a USB device (load device 21) such as sensors and PC peripherals, for example. The high-side switch IC is used to control the supply/interruption of power supply by commands from the microcontroller 23 and to protect the device by interrupting the power supply when an abnormality such as a short circuit occurs during monitoring of the status of the device (load device 21) by the microcontroller 23.

As shown in FIG. 6, the conventional high-side switch IC 10 includes a switching transistor M1 that is connected between the voltage input terminal IN to which the power supply voltage is input from the power supply 20 and the output terminal OUT to which the load device 21 is connected, and a logic circuit 11 that controls the transistor on and off. The conventional high-side switch IC 10 is configured to supply/interrupt the power supply by the on/off control signal being input from the control device such as an external microcontroller to the control terminal CE as an external terminal of the IC. As the disclosures of high-side switch IC having such a function, there are disclosures described in JP 2002-91584A and JP 2012-90214A, for example.

In the high-side switch IC having the configuration as shown in FIG. 6, when the gate terminal of transistor M1 is made low level and M1 is turned on, conduction occurs between the input terminal IN and the output terminal OUT via the on-resistance Ron of M1, and current flows. Therefore, as shown in FIG. 7, the output voltage Vout changes in accordance with the output current Iout flowing to the load, resulting in $\Delta V$.

Therefore, to reduce the fluctuation range of output voltage Vout, it is necessary to use, as M1, the transistor with a small on-resistance Ron, in other words, the transistor with a large element size, and increase the number of bonding wires, which leads to an increase in chip cost. Also, when the output current Iout changes abruptly to change the output voltage Vout, the noise occurs. Thus, there is a problem that it is necessary to use a large-capacity capacitor as a smoothing capacitor Co for stabilization to be connected to the output terminal as a measure against noise and provide a filter circuit, which increases the cost.

Furthermore, to ensure that a given supply voltage is supplied to the power supply terminal of the load device regardless of the on-resistance of transistor M1, the voltage input to the voltage input terminal from the power supply need be corrected. For example, there could be a method of shifting the voltage to a higher voltage by the voltage drop due to the on-resistance, and setting the input voltage to the midpoint where it falls within the specified range of output voltage. However, there is a problem that the correction amount need be changed for each system according to the magnitude of the current consumption of the load device connected to the output terminal, which increases the design burden on the user.

SUMMARY

In view of the above-described problems, an object of the present disclosure is to provide a semiconductor integrated circuit device as a high-side switch IC that can suppress the increase in chip cost required for measures against a drop in output voltage due to the on-resistance of a transistor.

Another object of the present disclosure is to provide a semiconductor integrated circuit device as a high-side switch IC that can suppress noise generation by reducing output voltage fluctuations and reduce the cost required for noise suppression.

Another object of the present disclosure is to provide a semiconductor integrated circuit device as a high-side switch IC that does not require correction of input voltage for each system, thereby reducing the design burden on the user.

To achieve at least one of the abovementioned objects, according to an aspect of the present disclosure, there is provided a semiconductor integrated circuit device including: a switching transistor that is connected between a voltage output terminal and a voltage input terminal to which a DC voltage is input; a terminal to which a control signal is input from outside; and a control circuit that controls the switching transistor to an on state or an off state based on the control signal, wherein the control circuit includes: a reference voltage source that generates a reference voltage from the DC voltage which is input to the voltage input terminal; a differential amplifier to which the reference voltage and a voltage of the voltage output terminal are input, and which outputs a voltage to be applied to a control terminal of the switching transistor; and a logic circuit that generates a signal to control an operation state of the differential amplifier based on the control signal input to the terminal, and according to an output signal of the logic circuit, the differential amplifier controls the switching transistor to the on state in response to the control signal being a first logic level, and controls the switching transistor to the off state in response to the control signal being a second logic level.

BRIEF DESCRIPTION OF THE DRAWINGS

The accompanying drawings are not intended as a definition of the limits of the invention but illustrate embodiments of the invention, and together with the general description given above and the detailed description of the embodiments given below, serve to explain the principles of the invention, wherein.

DETAILED DESCRIPTION OF EMBODIMENTS

Hereinafter, one or more embodiments of the present invention will be described with reference to the drawings. However, the scope of the present invention is not limited to the disclosed embodiments.

Figure 1:
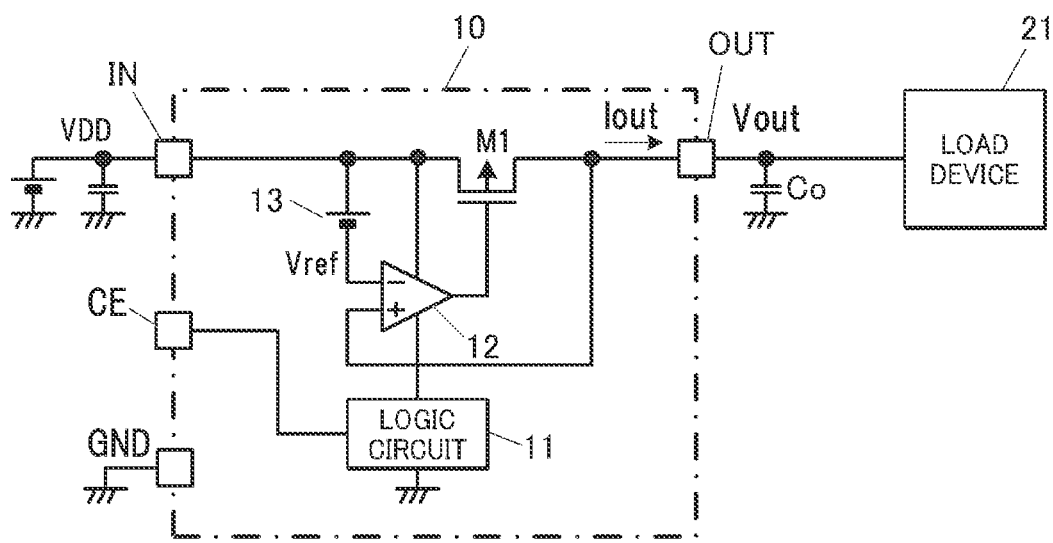
FIG. 1 is a circuit configuration diagram showing an embodiment of a high-side switch IC to which the present disclosure is applied.

FIG. 1 shows an embodiment of a high-side switch IC to which the present disclosure is applied. In FIG. 1, the area surrounded by a single dotted line is formed as a semiconductor integrated circuit (IC) 10 on a semiconductor chip such as single-crystal silicon. A capacitor Co for output stabilization is connected to the output terminal OUT of the IC 10.

In the high-side switch IC 10 of the embodiment, as shown in FIG. 1, a switching transistor M1 consisting of a P-channel MOS transistor is connected between the voltage input terminal IN to which the DC voltage VDD is applied and the output terminal OUT to which the various devices that serve as the load device 21 are connected. The IC also includes: a chip control terminal CE to which a signal from an external microcontroller (CPU) or the like is input; a logic circuit 11 that takes the potential of terminal CE as input; and a differential amplifier (differential amplifier circuit) 12 that generates the gate control signal of transistor M1 by the output of logic circuit 11. The logic circuit 11 controls the differential amplifier 12 on or off according to the potential of terminal CE. The logic circuit 11 is configured with an inverter or other logic gate circuit to have the desired logic function.

Figure 2:
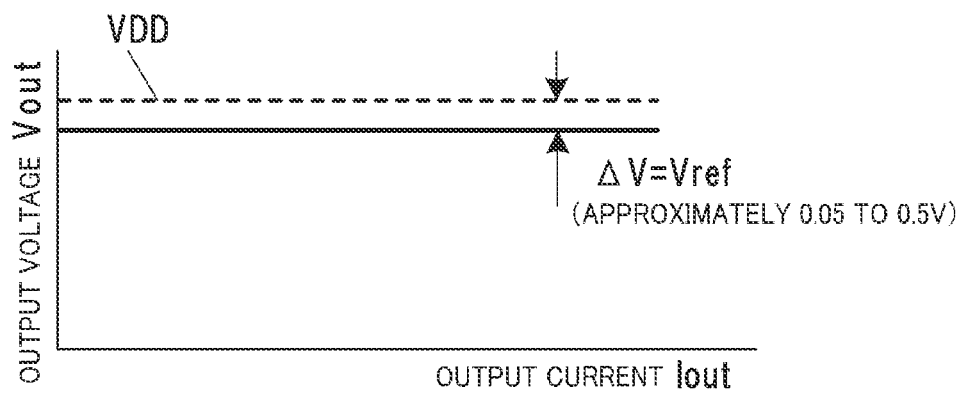
FIG. 2 is a characteristic diagram of the output current output voltage characteristic of the high-side switch IC of the embodiment.

Between the inverting input terminal (−) of the differential amplifier 12 and the voltage input terminal IN, a reference voltage source 13 that generates the reference voltage Vref is connected, and the voltage Vout of the output terminal OUT is input to the non-inverting input terminal (+) of the differential amplifier 12. Therefore, the differential amplifier 12 drives the gate terminal of M1 so that the voltage Vout of the output terminal OUT, that is, the drain voltage of transistor M1, is the same as the voltage (VDD−Vref) of the inverting input terminal (−) due to an imaginary short circuit. As a result, the transistor M1, differential amplifier 12, and reference voltage source 13 operate as a constant voltage circuit to generate and output a constant voltage (VDD−Vref) even if the output current Iout flowing to the load device 21 changes, as shown in FIG. 2.

The switching transistor M1 may be designed to have a characteristic that its on-resistance satisfies the condition that Ron<Vref/Iout when its on-resistance is Ron and the maximum output current specified as the specification of the IC is Iout. If the user intends to supply a predetermined voltage Vcc to the power supply voltage terminal of the load device 21 regardless of the size of the current flowing in the load, the power supply voltage VDD input to the voltage input terminal IN may be set to a voltage shifted higher than Vcc by ΔV, which is equivalent to the difference between the voltage at the input terminal IN and the voltage at the output terminal OUT.

Figure 6:
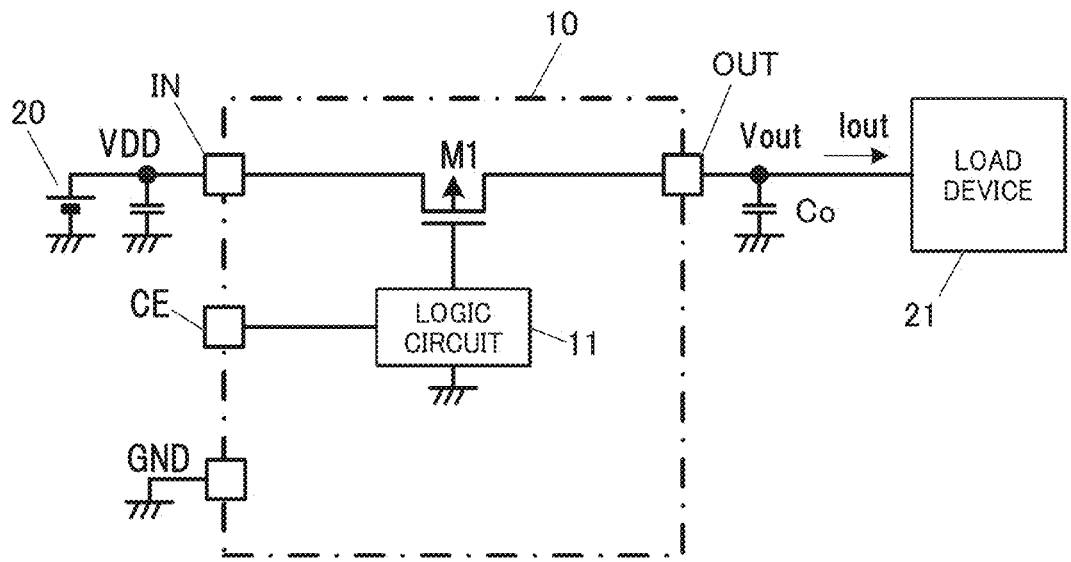
FIG. 6 is a circuit configuration diagram showing the general configuration of a conventional high-side switch IC.
Figure 7:
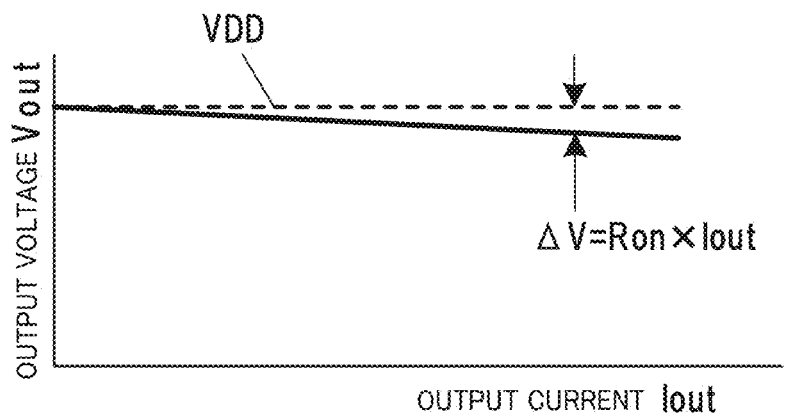
FIG. 7 is the characteristic diagram showing the output current output voltage characteristic of the high-side switch IC shown in FIG. 6.

In the conventional high-side switch IC shown in FIG. 6, the voltage supplied fluctuates when the output current flowing to the load device 21 differs. Therefore, to reduce the fluctuation range of output voltage Vout even when output current Iout fluctuates, it is necessary to use a transistor with a large element size as M1 or to increase the number of bonding wires, as described above, which is a problem leading to an increase in chip cost. In contrast, in the high-side switch IC of the embodiment, the transistor M1 operates as an output transistor of the constant voltage circuit. Thus, by inputting in advance the voltage higher by ΔV to the input terminal IN, there is no need to use a transistor with a considerably large element size as M1 or to increase the number of bonding wires, thus avoiding an increase in chip cost.

In addition, the output voltage Vout fluctuation can be reduced even when the output current Iout fluctuates, thus suppressing noise generation and reducing the cost required for noise suppression.

Furthermore, since a constant voltage is generated and output even if the output current Iout flowing to the load device 21 changes, input voltage correction is not required when using a load device 21 with a different current consumption connected to the output terminal, thereby reducing the design burden on the user.

As an appropriate value for the above reference voltage Vref, for example, 0.05 V to 0.5 V can be considered.

Figure 3:
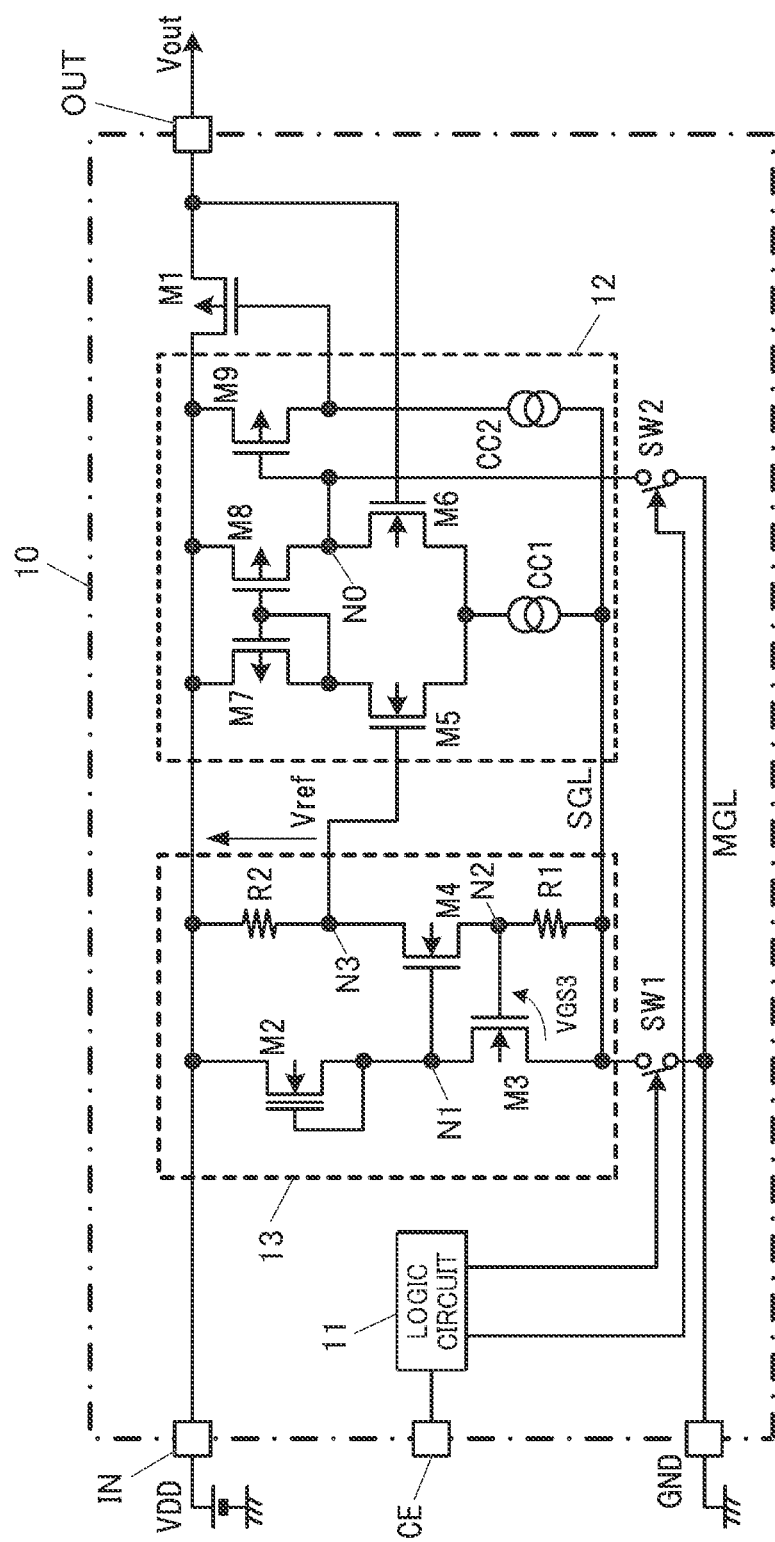
FIG. 3 is a circuit diagram showing a specific circuit example of the high-side switch IC of the embodiment.

Next, a specific circuit example of the high-side switch IC 10 shown in FIG. 1 is explained using FIG. 3.

As shown in FIG. 3, the differential amplifier 12 includes: differential transistors M5 and M6 consisting of N-channel MOS transistors and having a common source terminal connected; a constant current source CC1 connected between the common source of M5 and M6 and the ground point; a differential input stage consisting of active load transistors M7 and M8 consisting of P-channel MOS transistors respectively connected between the drain terminals of M5 and M6 and the voltage input terminal IN; and an output stage consisting of P-channel MOS transistor M9 and constant current source CC2 connected in series between voltage input terminal IN and ground point. The gate and drain terminals of transistor M7 are coupled, and the gate terminal of M8 is connected to the gate terminal of M7. The gate terminal of transistor M9 of the above output stage is connected to the connection node of transistors M8 and M6, that is, the output node NO of the differential input stage.

The reference voltage source 13 includes: a depletion-type N-channel MOS transistor M2 and an enhancement type N-channel MOS transistor M3 connected in series between the voltage input terminal IN and the ground point; and a resistor R2, an N-channel MOS transistor M4 and a resistor R1 which are connected in series in this order between the voltage input terminal IN and the ground point.

Then, the depletion-type transistor M2 has the gate and source coupled to be always on, and the gate terminal of MOS transistor M3 is connected to the connection node N2 between M4 and resistor R1. The gate terminal of MOS transistor M4 is connected to the connection node N1 between M2 and M3. Thus, when the gate-source voltage of MOS transistor M3 is VGS3 and the voltage of connection node N3 connecting resistor R2 and the drain terminal of N-channel MOS transistor M4 is Vref, the reference voltage source 13 generates the reference voltage Vref represented by Vref=(R2/R1)×VGS3. The generated reference voltage Vref is input to the gate terminal of the differential transistor M5 of the differential amplifier 12. The voltage Vout of the output terminal is input to the gate terminal of the other differential transistor M6 of the differential amplifier 12.

Furthermore, in the embodiment, the switch elements SW1 and SW2 which are turned on and off by the output signal from the logic circuit 11 are provided between the sub ground line SGL and the main ground line MGL of the differential amplifier 12 and the reference voltage source 13 and between the gate terminal of transistor M9 of the output stage of the differential amplifier 12 and the main ground line MGL, respectively. The switch elements SW1 and SW2 are configured to be turned on or off complementarily by the output signal from the logic circuit 11.

In the above configuration, the logic circuit 11 can be configured, for example, by an inverter that inverts the logic level of the terminal CE for chip control and an inverter that further inverts the output of this inverter. The output of the inverter in the succeeding stage controls the switch element SW1, and the output of the inverter in the preceding stage controls the switch element SW2.

Thus, when a high level signal is input to the control terminal CE, the switch element SW1 is turned on to activate the reference voltage source 13 and the differential amplifier 12. The switch element SW2 is turned off, and the switching transistor M1 connected between the voltage input terminal IN and the output terminal OUT is controlled to the on state by the output of the differential amplifier 12.

On the other hand, when a low level signal is input to the control terminal CE, the switch element SW1 is turned off to stop the operation of the reference voltage source 13 and the differential amplifier 12. The switch element SW2 is turned on and a ground potential is applied to the gate terminal of the transistor M9 in the output stage of the differential amplifier 12 to bring M9 to a complete on state. This causes the input voltage VDD to be applied to the gate terminal of the switching transistor M1 connected between the voltage input terminal IN and the output terminal OUT, and M1 is turned off.

Although it is possible to omit the switch element SW1 as for the operation of the IC, the current consumption of the IC while the switching transistor M1 is turned off can be reduced by providing the switch element SW1. From the viewpoint of low current consumption of the IC, a CMOS inverter is desirably used as the inverter that constitutes the logic circuit 11.

When the constant current sources CC1 and CC2 of the differential amplifier 12 are configured with, for example, current mirror circuits, the constant current sources CC1 and CC2 may be directly controlled on and off by the output of the logic circuit 11.

The basic configuration of the reference voltage source 13 using a depletion-type MOS transistor is disclosed and publicly known in JP 2000-112548A and the like, and thus the detailed explanation of the operation is omitted. The positive temperature characteristic of the depletion-type transistor M2 can be cancelled by the negative temperature characteristic of the transistor M3 to generate a temperature-independent reference voltage Vref.

In addition, since resistors R2 and R1 are provided in the source follower circuit section, by appropriately designing the resistance ratio, the reference voltage Vref of 0.05 V to 0.5 V mentioned above can be generated with the input voltage VDD as a reference.

Modification Example

Figure 4:
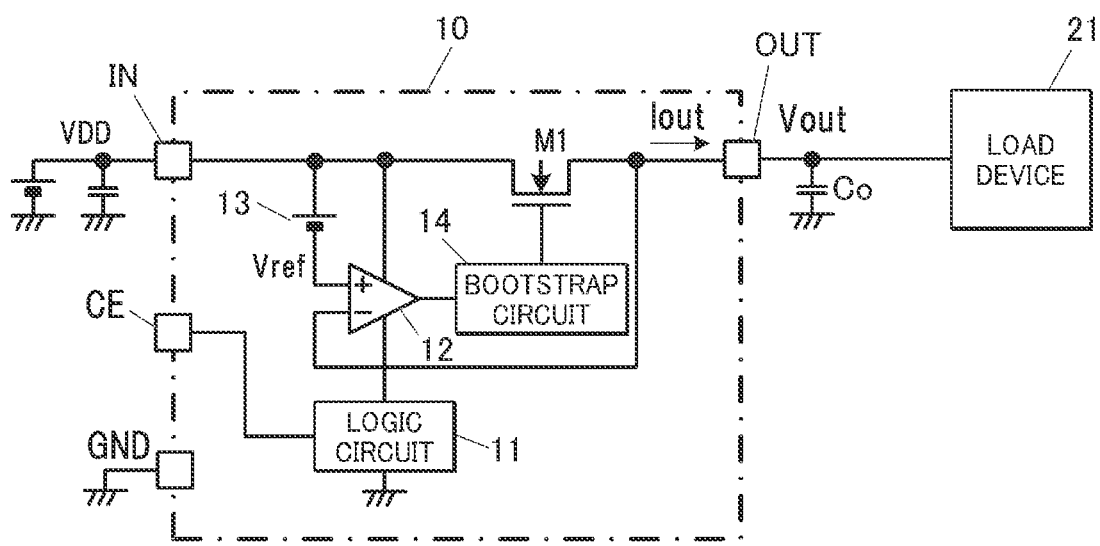
FIG. 4 is a circuit configuration diagram showing a modification example of the high-side switch IC of the embodiment.
Figure 5:
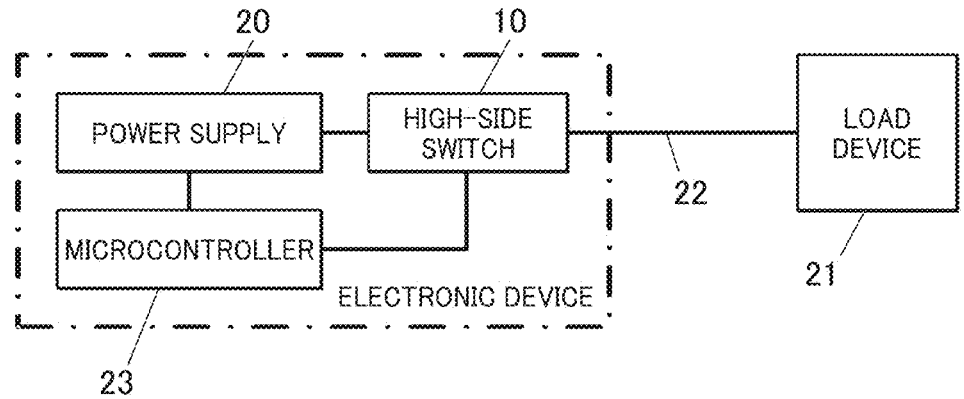
FIG. 5 is a system configuration diagram showing the general configuration of a system using a high-side switch IC.

FIG. 4 shows a modification example of the high-side switch IC 10 of the above embodiment. The modification example of the high-side switch IC 10 shown in FIG. 4 is configured to use, instead of a P-channel MOS transistor, an N-channel MOS transistor as the switching transistor M1 connected between the voltage input terminal IN and the output terminal OUT, and provide a bootstrap circuit 14 consisting of a charge pump or the like in the succeeding stage of the differential amplifier 12, so that the transistor M1 is turned on by a voltage obtained by boosting the output voltage of the differential amplifier 12.

In the modification example, the reference voltage Vref is input to the non-inverting input terminal of the differential amplifier 12, and the output voltage Vout is input to the inverting input terminal.

If the N-channel type transistor M1 is turned on by the output voltage of differential amplifier 12 without the bootstrap circuit 14, M1 is incompletely turned on and the output voltage Vout becomes lower than the input voltage VDD by the threshold voltage of the MOS transistor. By turning on transistor M1 at a voltage that boosts the output voltage of the differential amplifier 12, it is possible to turn on completely and prevent the output voltage Vout from becoming low. There is also an advantage that when the user intends to achieve the same current supply capability, by using an N-channel MOS transistor instead of a P-channel MOS transistor, the device size can be reduced by about half, and it is possible to reduce the chip size of the IC.

The high-side switch IC 10 may also include: an over-current protection circuit to protect the switching transistor M1 from overcurrent; a current limit circuit to limit the current so that the output current Iout does not flow more than a predetermined value; and a thermal shutdown circuit that generates and outputs a signal to turn off the output transistor when it is detected that the chip temperature becomes a predetermined value or more.

Since the overcurrent protection circuit, current limit circuit, and thermal shutdown circuit in the high-side switch IC are well-known technologies, examples of circuit configurations and descriptions of their operations are omitted.

Although the present disclosure is specifically described based on the embodiments, the present disclosure is not limited to the above embodiments. For example, in the above embodiment, a MOS transistor is used as the transistor that constitutes the internal circuit of the high-side switch IC 10. However, a bipolar transistor may be used instead of a MOS transistor. The transistor M1 may be a discrete transistor to lower the on-resistance.

The high-side switch IC 10 may also be provided with an external terminal and a detection signal output circuit to output a detection signal to outside when the overcurrent detection circuit detects an overcurrent or the current limit circuit or thermal shutdown circuit detects a current error or chip temperature error.

According to the embodiment, there is provided a semiconductor integrated circuit device including: a switching transistor that is connected between a voltage output terminal and a voltage input terminal to which a DC voltage is input; a terminal to which a control signal is input from outside; and a control circuit that controls the switching transistor to an on state or an off state based on the control signal, wherein the control circuit includes: a reference voltage source that generates a reference voltage from the DC voltage which is input to the voltage input terminal; a differential amplifier to which the reference voltage and a voltage of the voltage output terminal are input, and which outputs a voltage to be applied to a control terminal of the switching transistor; and a logic circuit that generates a signal to control an operation state of the differential amplifier based on the control signal input to the terminal, and according to an output signal of the logic circuit, the differential amplifier controls the switching transistor to the on state in response to the control signal being a first logic level, and controls the switching transistor to the off state in response to the control signal being a second logic level.

According to the semiconductor integrated circuit device having the above configuration, the differential amplifier, which constitutes the control circuit controlling the switching transistor, operates to match the potential of the inverting input terminal with that of the non-inverting input terminal, so that the reference voltage source, differential amplifier and switching transistor operate as a constant voltage circuit. Therefore, the output voltage can be maintained constant even when the output current, that is, the current flowing to the load device changes, and output voltage instability due to transistor on-resistance can be prevented. It is also possible to prevent fluctuations in output voltage due to changes in output current and suppress noise generation.

By applying, to the voltage input terminal, the voltage to which the above constant voltage is applied, the increase in chip cost required for measures to reduce the output voltage drop, such as increasing the size of the switching transistor, can be suppressed, and the output voltage fluctuation caused by load current changes can be reduced to suppress noise generation. Thus, the cost required for noise suppression can be reduced.

Furthermore, since the amount of voltage drop due to the on-resistance of the switching transistor is constant regardless of the magnitude of the output current, there is no need to change the input voltage correction for each system, reducing the design burden on the user.

According to the embodiment, in a semiconductor integrated circuit device as a high-side switch IC with a transistor connected between a voltage input terminal and an output terminal, the increase in chip cost required for measures against a drop in output voltage due to on-resistance of the transistor can be suppressed. In addition, output voltage fluctuations can be reduced and noise generation can be suppressed, thus reducing the cost required for noise suppression. Furthermore, the input voltage correction for each system is not required, which has the effect of reducing the design burden on the user.

Although some embodiments of the present invention have been described and illustrated in detail, the disclosed embodiments are made for purposes of not limitation but illustration and example only. The scope of the present invention should be interpreted by terms of the appended claims.

What is claimed is:

1. A semiconductor integrated circuit device, comprising:
   a switching transistor that is connected between a voltage output terminal and a voltage input terminal to which a DC voltage is input;
   a terminal to which a control signal is input from outside; and
   a control circuit that controls the switching transistor to an on state or an off state based on the control signal,
   wherein the control circuit includes:
      a reference voltage source that generates a reference voltage from the DC voltage which is input to the voltage input terminal;
      a differential amplifier to which the reference voltage and a voltage of the voltage output terminal are directly input, and which outputs a voltage to be applied to a control terminal of the switching transistor; and
      a logic circuit that generates a signal to control an operation state of the differential amplifier based on the control signal input to the terminal,
   wherein according to an output signal of the logic circuit, the differential amplifier controls the switching transistor to the on state in response to the control signal being a first logic level, and controls the switching transistor to the off state in response to the control signal being a second logic level, and
   wherein a voltage lowered by the reference voltage from the DC voltage input to the voltage input terminal is output to the voltage output terminal.

2. The semiconductor integrated circuit device according to claim 1, wherein the switching transistor has a characteristic that an on-resistance of the switching transistor satisfies a condition of Ron<Vref/Iout, Ron being the on-resistance, Vref being the reference voltage, and Iout being an output current that flows toward the voltage output terminal from the switching transistor.

3. The semiconductor integrated circuit device according to claim 1, wherein:
   the differential amplifier includes a differential input stage that comprises a pair of differential transistors and an output stage that is provided to a succeeding stage of the differential input stage,
   a transistor in the output stage comprises a control terminal connected to an output node in the differential input stage, and a first switch element that is controlled to be turned on or off based on a signal output from the logic circuit is provided between the control terminal of the transistor in the output stage and a ground point, and
   in response to the control signal being the second logic level, an operation current of the differential input stage is interrupted, and a differential amplifying operation of the differential amplifier is stopped in a state in which the switching transistor is maintained in the off state.

4. The semiconductor integrated circuit device according to claim 3, wherein:
   each of the switching transistor and the transistor in the output stage includes a P-channel MOS transistor, and
   the transistor in the output stage comprises a source terminal connected to the voltage input terminal, the transistor in the output stage is turned on by the first switch element being turned on in response to the control signal being the second logic level, and the transistor in the output stage maintains the switching transistor in the off state.

5. The semiconductor integrated circuit device according to claim 3, wherein:
   a second switch element that is controlled to be turned on or off based on a signal output from the logic circuit is connected between the reference voltage source and a ground point, and the reference voltage source stops operating by the second switch element being turned off in response to the control signal being the second logic level.

6. The semiconductor integrated circuit device according to claim 3, wherein:
the switching transistor includes an N-channel MOS transistor, and
a bootstrap circuit that increases a level of an output of the differential amplifier is provided between an output terminal of the differential amplifier and the control terminal of the switching transistor.

* * * * *